United States Patent

Piccone et al.

[15] 3,662,250

[45] May 9, 1972

[54] THYRISTOR OVERVOLTAGE PROTECTIVE CIRCUIT

[72] Inventors: Dante E. Piccone, Philadelphia; Istvan Somos, Lansdowne, both of Pa.

[73] Assignee: General Electric Company

[22] Filed: Nov. 12, 1970

[21] Appl. No.: 88,853

[52] U.S. Cl. ....................321/11, 307/252 G, 307/252 Q, 321/27 R

[51] Int. Cl. .................................................H02m 1/18

[58] Field of Search ...............321/11, 27; 307/252 R, 252 K, 307/252 G, 252 Q

[56] References Cited

UNITED STATES PATENTS

| | | | |
|---|---|---|---|
| 3,293,449 | 12/1966 | Gutzwiller | 307/252 |
| 3,407,335 | 10/1968 | Hartung | 317/16 |
| 3,412,312 | 11/1968 | Rice | 321/11 |
| 3,423,664 | 1/1969 | Dewey | 321/11 |
| 3,448,300 | 6/1969 | Gyugyi | 307/254 X |
| 3,449,649 | 6/1969 | Irmler et al. | 317/235 |
| 3,486,088 | 12/1969 | Gray et al. | 317/235 |
| 3,567,972 | 3/1971 | Faust | 307/311 |

OTHER PUBLICATIONS

General Electric SCR Manual, 4th Ed., 1967, pp. 46, 323- 30.

*Primary Examiner*—William M. Shoop, Jr.
*Attorney*—J. Wesley Haubner, Albert S. Richardson, Jr., Frank L. Neuhauser, Oscar B. Waddell and Joseph B. Forman

[57] ABSTRACT

A high-power main thyristor is protected from forward voltage breakover by connecting in parallel relationship therewith an improved overvoltage responsive trigger scheme comprising at least one PNPN semiconductor element and a series L-C circuit. The PNPN element is connected between the anode and the gate of the main thyristor, and the L-C circuit is connected between the gate and the cathode. The element is selected to turn on in a voltage breakover mode when the forward bias voltage on the main thyristor attains a predetermined magnitude which is lower than the breakover level of the thyristor, whereupon the latter is triggered by a sharp gate punch.

20 Claims, 9 Drawing Figures

INVENTORS:
DANTE E. PICCONE,
ISTVAN SOMOS,
BY Albert S. Richardson Jr.
ATTORNEY

INVENTORS:
DANTE E. PICCONE,
ISTVAN SOMOS,
BY Albert S. Richardson Jr.
ATTORNEY

THYRISTOR OVERVOLTAGE PROTECTIVE CIRCUIT

This invention relates generally to an electric control and protective circuit for triggering a relatively high-current, high-voltage solid-state controlled switching device when a forward bias voltage of appreciable magnitude is impressed on the device, and more particularly it relates to a triggering scheme for insuring safe turn-on of an array of parallel "thyristors" in the event of an overvoltage condition.

Thyristor is a generic name for a family of solid-state bistable switches, including silicon controlled rectifiers (SCR's), which are physically characterized by a body of monocrystalline semiconductor material between a pair of main current-carrying metallic electrodes (often designated the anode and the cathode, respectively). The semiconductor body may comprise, for example, a thin, broad area disc-like wafer having four layers of alternately P- and N-type conductivities, whereby three back-to-back PN (rectifying) junctions are formed between the main electrodes. Usually the wafer is mechanically sealed in an insulating housing and is electrically connected in an external power circuit by way of its anode and cathode. Suitable gating means is provided for initiating conduction between these main electrodes on receipt of a predetermined control or trigger signal.

When connected in series with a load impedance and subjected to a forward bias voltage (anode potential positive with respect to cathode), a thyristor will ordinarily block the flow of load current until triggered or "fired" by the application to its gate of a control signal above a small threshold value, whereupon it abruptly switches from a high resistance to a very low-resistance, forward conducting (on) state. Subsequently the device reverts to its nonconducting (turned off) state in response to through current being reduced below a given holding level. Hereinafter, the main current flowing through the thyristor between its anode and its cathode will be referred to as the anode current (*i*), and the potential difference between the anode and the cathode will be referred to as the anode voltage (*v*).

The forward current and peak blocking voltage ratings of a thyristor are specified by the manufacturer. These ratings determine, under stated conditions and without damaging the thyristor, the maximum load current that the thyristor can conduct when on and the maximum applied voltage that it can safely withstand when off. High-current ratings are generally obtained by using relatively large area semiconductor wafers, while high-voltage ratings require relatively thick base layers in the wafers. Thus, by way of example, a thyristor having a maximum continuous RMS forward current rating of 500 amperes and a repetitive peak forward blocking voltage rating of 2,600 volts at an operating junction temperature of 100° C. may have a wafer whose area is approximately one square inch and whose thickness is approximately 0.02 inch.

The above-mentioned ratings and dimensions exemplify individual high-power thyristors that are commercially available today. Such ratings are still much lower than required for very high-power switching applications. One such application is in the field of high-voltage direct-current power transmission where a plurality of controllable electric valves are interconnected and arranged to form a high-current converter for controlling the flow of bulk electric power between DC and AC sections of a high-voltage power transmission system. As much as 2,000 amperes may be carried by each converter valve in its on state, and well over 20,000 volts may be applied across the valve when off. To make a solid-state valve of this size, a plurality of arrays of parallel thyristors must be interconnected in series and operated in unison.

During those cyclically recurring intervals when the above-mentioned converter valve is in an off or blocking state, the valve and its associated equipment are prone to being damaged by extra high voltage surges that may be produced by a variety of different transient phenomena, such, for example, as lightning strokes, bushing flashovers, or inverter commutation failure. Lightning arrestors are commonly used to harmlessly divert and suppress overvoltage transients, but it is believed impractical and unwise to rely solely on such arrestors to protect solid-state valves when exposed to abnormal voltage surges in the forward direction. In addition, since the arrestor is usually connected across the whole valve, there is no guarantee that each constituent thyristor of the valve will not individually be subjected to excessive voltage. In another overvoltage protection scheme that has heretofore been proposed (see U.S. Pat. No. 2,585,796), a firing signal is applied to the control electrode of the valve as soon as a surge of forward anode voltage is sensed, thereby turning on the valve itself before that voltage attains a destructively high level.

The latter scheme is particularly advantageous in a solid-state valve of the kind herein contemplated. If no trigger signal were applied to the gage of a thyristor and anode voltage were allowed to increase to a critical level above its rated peak forward blocking voltage, the thyristor will turn on due to a voltage breakover. This mode of turn-on, which can be caused by an avalanche breakdown, a punch through, or excessive leakage, is a known phenomenon in the thyristor art. It is also known that the normal *di/dt* capabilities of conventional high-voltage thyristors (e.g., thyristors having peak blocking voltages over 1,500 volts) are seriously degraded when turned on in this mode.

The *di/dt* capability of a thyristor refers to the maximum initial rate of rise of forward anode current (in-rush current slope) that the thyristor can tolerate without permanent damage when switching from blocking to fully conducting states. The maximum allowable *di/dt* during a single voltage breakover transient, and also during 60 Hz. voltage breakover operation of the thyristor, is determined by the local temperature rise of the initially turned on area of the semiconductor wafer.

In the event of a voltage breakover, conduction begins in a relatively small area of the thyristor, and the applied voltage is very high. When the breakover action commences, the voltage across the thyristor is equal to the breakover level, whereupon it will decrease in a short time (e.g., 1 microsecond) to a value of the order of 50 to 100 volts and then more gradually, as the conducting area progressively spreads over the whole semiconductor wafer, to a lower steady-state forward anode voltage drop. Such high initial voltages result in a high instantaneous *vi* heat dissipation and high local temperature rise. To keep this heat dissipation from exceeding a permissible limit, the anode current must be limited to relatively low values during the turn on action, i.e., the initial *di/dt* must be low. This problem is aggravated in broad area, high current thyristors, because the junction capacitance of such a device is relatively high and when triggered the rapid discharge thereof contributes an appreciable initial current component which will not be attenuated by whatever *di/dt* limiting inductance may be connected in the external load current circuit.

To some degree the foregoing problem is alleviated by using an improved thyristor such as is disclosed and claimed in U.S. Pat. No. 3,408,545—DeCecco et al., or by providing a protective circuit that is arranged to apply a strong trigger signal to the gating means of a conventional thyristor in response to an overvoltage condition, whereby the thyristor is turned on in its gating mode before the applied voltage attains a destructively high level. Examples of such protective circuits are disclosed in U.S. Pat. Nos. 3,424,948 and 3,487,261.

To construct a high-voltage solid-state valve having a given peak blocking voltage rating, it is of course desirable from the viewpoints of low cost and high operating efficiency to use as few levels of thyristors in series as possible, with each thyristor being designed individually to withstand in its off state as much voltage as is practical. But, as mentioned above, when the valve is turned on in response to a forward voltage surge, a relatively high voltage across any one of its levels will undesirably reduce the *di/dt* which the thyristors in that level can accept without damage. An adequate margin of safety in this regard may require the use of many more thyristors in series than are otherwise needed.

The need for surplus or extra thyristor levels in a high-voltage valve can be alleviated to some extent by certain other approaches that have previously been proposed, in various combinations. To preserve substantially equal distribution of the total valve voltage among the constituent thyristors in the event of a fast-rising voltage surge, extra grading capacitors can be used. To help relieve the maximum surge voltage duty imposed on the whole valve, the associated lightning arrestor could be redesigned to have increased operating speed. The rate of rise of surge voltage itself can be limited or softened by means of extra inductance in the main current conductors connecting the respective valves of the converter to the high-voltage bushings of the converter station. The rate at which load current increases when a valve is triggered can be limited by reactors in series therewith.

Insofar as we are presently aware, all of the known solutions to the identified problems have serious shortcomings. When additional or larger auxiliary components are required, there will be concomitant increases in the cost of manufacture, the space occupied, and hence the expense of the whole installation. There will also be an increase in electric power losses, i.e., a reduction in operating efficiency.

Furthermore, we believe that the special protective circuits heretofore disclosed for gate triggering the valve itself in response to overvoltage transients are less than ideally effective, particularly for very high current valves, with respect to accommodating a high *di/dt* and reducing the number of serially interconnected thyristors required for reliable and safe operation at any given peak blocking voltage rating. Accordingly, a general objective of our present invention is the provision, for protecting thyristors against excessive overvoltages, of a triggering scheme which overcomes the shortcomings of the pertinent prior art and which is particularly well suited for improving the performance and reducing the costs of electric power conversion apparatus whose main switching components comprise high-voltage, high-current solid-state valves.

It is another objective of our invention to provide an improved overvoltage triggering scheme for controlling as well as for protecting an array of parallel thyristors.

In carrying out our invention in one form, a main thyristor, or a group of parallel thyristors, is shunted by a protective circuit which is constructed and arranged to perform three functions in concert: (1) switch abruptly from a normal high-resistance state to a low-resistance, current conducting state in high-speed response to the forward bias voltage on the main thyristor rising to an overvoltage magnitude within a preselected range which is between the normally applied peak forward blocking voltage and the breakover level thereof, (2) immediately apply a trigger signal to the gating means of the main thyristor, whereupon the main thyristor is quickly turned on by a sharp gate punch, and (3) sustain the trigger signal for an interval of time appreciably longer than the minimum required to turn on the main thyristor, or the first-on thyristor of a parallel group. Preferably this protective circuit comprises overvoltage sensing and switching means in series with energy storing means, with the juncture therebetween being coupled to the gating means of the main thyristor. The overvoltage sensing and switching means can comprise an auxiliary overvoltage triggered controlled switching device or, preferably, a plurality of such elements in series, and the energy storing means comprises an inductor in series with a capacitor. Once the auxiliary elements switch to their conducting state, the forward bias voltage across the parallel main thyristor collapses to a relatively low value and the latter can safely turn on with a very high *di/dt*. Thereafter load current is diverted from the auxiliary switching elements to the main thyristor which provides a lower resistance path for this current. The individual auxiliary elements, which can be very small devices, are each turned on when forward biased by only a fraction of the aforesaid overvoltage magnitude, and because of their brief conducting interval they can operate at ambient temperature. Consequently these elements themselves will tolerate a very high *di/dt*. The energy storing means of the protective circuit serves as a current source which both turns off the auxiliary elements and continues to supply the trigger signal after the first main thyristor is turned on, thereby insuring successful triggering of any additional thyristors that may be connected in parallel therewith.

By respectively connecting a plurality of protective circuits such as the one summarized above in parallel with the various levels of a string of main thyristors that are serially interconnected to form a high-voltage solid-state valve, each level of the valve will be quickly and safely turned on in response to a severe forward overvoltage transient before the voltage attains a destructively high magnitude. The protective circuits can also be relied on to perform a "back-up" triggering function in the event of an abnormal build up of voltage on any level due to a failure of the regular triggering means that is associated with that level. Furthermore, in DC choppers, pulse modulators, inverters, or the like, such circuits can be used if desired to replace selected triggering circuits that are normally provided for simultaneously controlling the respective levels of the valve, or an auxiliary switching element in the protective circuit can itself be turned on by a conventional control signal in a pilot triggering arrangement.

Our invention will be better understood and its various objects and advantages will be more fully appreciated from the following description taken in conjunction with the accompanying drawings in which.

Figures 1, 2:
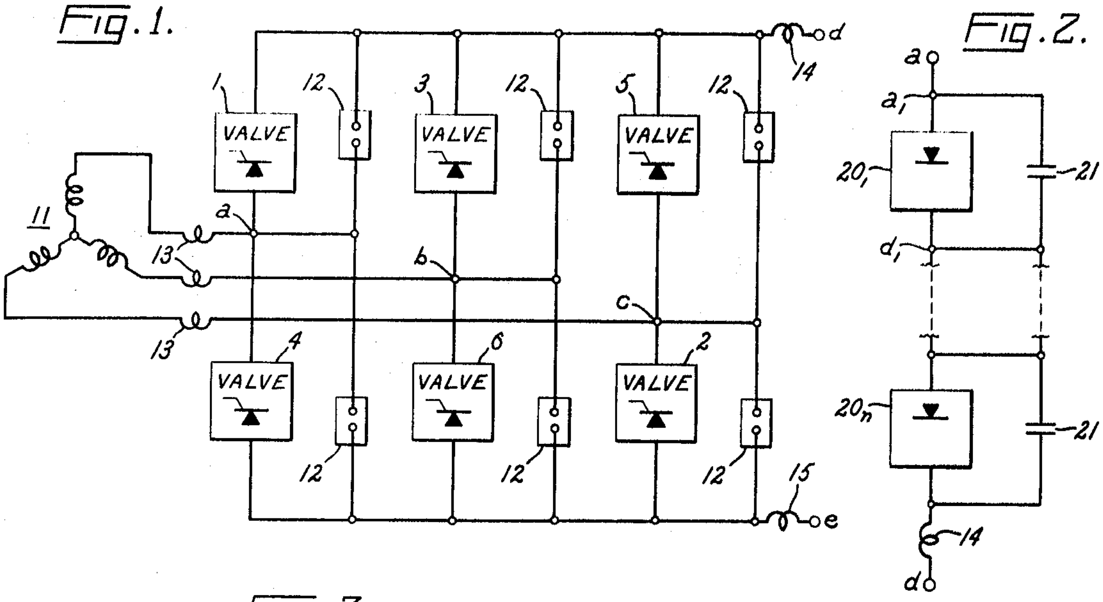
FIG. 1 is a schematic circuit diagram of an electric power converter in which high-voltage solid-state valves employing our invention can be advantageously used.
FIG. 2 is a schematic circuit diagram of a series string of duplicate thyristor panels comprising one of the six electric valves shown in block form in FIG. 1.
Figure 3:
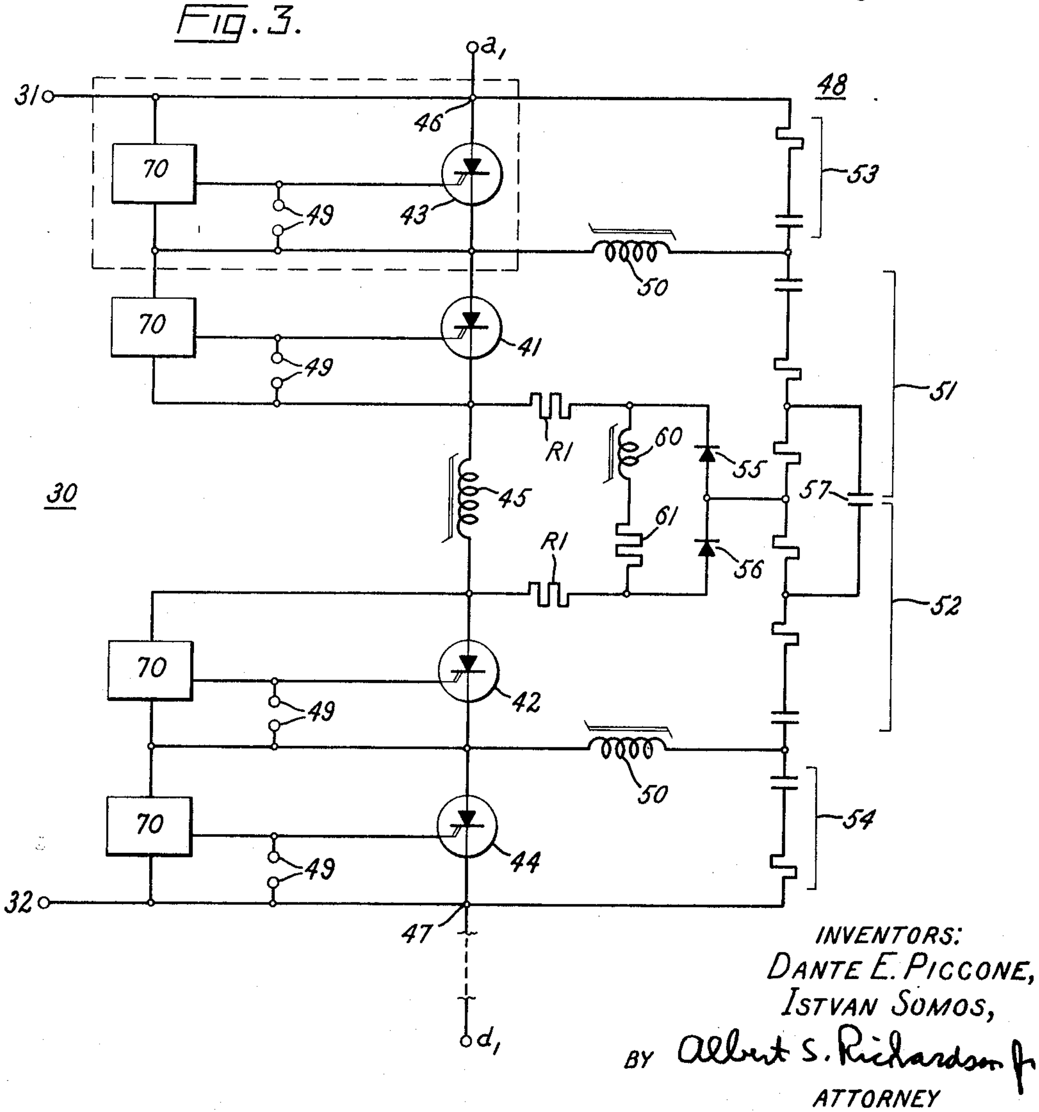
FIG. 3 is a schematic diagram of a high-current switching matrix included in one of the reiterative panels shown in block form in FIG. 2.

We have included FIGS. 1–3 in the present drawings for the purpose of illustrating one practical application of an overvoltage triggering scheme embodying our invention. FIG. 1 is a schematic circuit diagram of a high-voltage static power converter plant comprising a power transformer in combination with an AC/DC bridge. The transformer includes a set 11 of three star-connected windings inductively coupled to a companion set of windings (not shown) which in turn are adapted to be connected to the respective phases of a three-phase AC electric power system. The windings of the illustrated set 11 are respectively connected to AC terminals *a*, *b*, and *c* of the bridge which comprises six identical controlled valves 1, 2, 3, 4, 5, and 6 arranged in a three-phase double-way six-pulse configuration. Thus the cathodes of the odd-numbered valves are connected in common to an upper DC terminal *d* of the bridge, and the anodes of the even-numbered valves are connected in common to the other DC terminal *e*. By means of its DC terminals *d* and *e*, the illustrated bridge is connected, in series with other similar bridges if desired, to a high-voltage direct-current transmission line or the like.

By firing the six valves shown in FIG. 1 in their numbered sequence at intervals of 60 electrical degrees, three-phase alternating voltage applied to the AC terminals of the bridge can be rectified, i.e., converter to DC voltage. The average magnitude of the rectified voltage between the DC terminals $d$ and $e$ is maximum when the firing angle of the valves is zero. By increasing the firing angle to nearly 90°, the DC voltage can be reduced to zero. Still greater firing angles are used when the bridge is operating in its inverting mode, at which time the potential of terminal d is negative with respect to terminal $e$ and the DC electric power supplied to these terminals is converted by the bridge to three-phase AC power.

When each valve is fired in turn, it switches to an on state in which it can freely conduct load current in a forward direction until subsequently turned off by line voltage commutation, whereupon it remains off until fired again one cycle later. At various times during each of its off or nonconducting intervals, the valve has to withstand high peak voltages which the associated power system normally imposes thereon. In addition, a valve in its off state may be subjected to abnormal voltage surges due to transient phenomena such as lightning strokes or bushing flash-overs. To help prevent damage to the valve due to excessively high reverse or forward blocking voltages, suitable voltage surge supressors are commonly used. As is shown in FIG. 1, a lightning arrestor 12 is connected across each valve in the illustrated bridge.

Conventional lightning arrestors are relatively slow in operation, and in the event of a very fast rising forward voltage surge they may not adequately protect a solid-state valve. For this reason it has heretofore been proposed to reduce or soften the maximum rate of voltage rise at the valves by connecting inductors 13 between the transformer bushings (not shown) for the windings 11 and the respective AC terminals $a$, $b$, and $c$ of the bridge, and by connecting extra inductors 14 and 15 between the wall bushings for the DC terminals d and e of the bridge and the respectively associated valves.

The DC voltage rating of the FIG. 1 bridge depends on the individual voltage rating of each valve. FIG. 2 depicts the first valve 1 which is seen to comprise a series string of at least two identical thyristor panels $20_l$ and $20_n$ extending between terminals $a$ and $b$. Each thyristor panel has a predetermined voltage capability, and the rating of the valve is therefore a multiple of that capability. As will soon be described, each panel includes a resistance-capacitance network which is intended to ensure equal voltage sharing during both steady state and transient conditions. Nevertheless, when a severe forward voltage surge is imposed on the whole valve, there is a tendency for voltage to pile up across the panel or panels at one end thereof. In order to minimize the risk of damage due to excessively high voltage across any individual panel, it has heretofore been proposed to add grading capacitors in parallel with the panels. Thus a capacitor 21 is shown connected across the terminals $a_1$ and $d_1$ of panel $20_l$, and other capacitors are respectively connected across the remaining panels of the valve.

Each of the thyristor panels which form the valve shown in FIG. 2 is in turn made up of one or more high-current switching circuits or matrices 30. Further details of one such matrix are shown in FIG. 3. A switching matrix 30 comprises a commutation transient suppressing circuit in series with at least one section or level of thyristors.

The matrix 30 is a basic module or building block of the solid-state valve; it can be used by itself or in series with whatever number of reiterative matrices are required to construct a valve of the desired voltage rating. The main circuits of the matrix shown in FIG. 3 are intended to conform to the teachings of U.S. Pat. No. 3,423,664—Dewey, and they also embody certain improvements which are covered by Dewey's U.S. Pat. application, Ser. No. 888,432 filed Dec. 29, 1969, and assigned to the General Electric Company. These two references can be consulted for a more complete understanding of the operation of the matrix 30.

In FIG. 3 the matrix 30 is seen to comprise four levels 41, 42, 43, and 44 of thyristors connected in series with a main saturable core inductor 45 between an anode terminal 46 and a cathode terminal 47. Of course either more or less levels can be used if desired. Each level comprises at least one high-power thyristor having a predetermined peak forward blocking voltage rating such, for example, as 2,600 volts. To ensure steady-state and transient voltage sharing among the respective levels of the matrix, these levels are shunted by an R-C bypass network 48 as shown. The thyristors in the four levels 41–44 are arranged to permit conventional current to pass through the matrix from terminal 46 to terminal 47 when they are all triggered to forward conducting states.

Where the current rating desired for the matrix (e.g., 2,000 amperes RMS) exceeds the maximum forward current rating of an individual body of silicon, each thyristor level can be formed by connecting two or more of these elements in parallel with one another inside a common housing, or by electrically paralleling physically separate thyristors. In such a parallel array the respective elements or devices should be selected to turn on in unison and to conduct substantially equal shares of the whole matrix current. An improved thyristor well suited for this purpose is the subject matter of U.S. Pat. No. 3,489,962—McIntyre et al. It will therefore be apparent to those skilled in the art that the singular rectifier symbol with dual gates depicting each of the levels 41–44 in FIG. 3 is intended to represent an extra high current array of duplicate thyristors capable of contemporaneous switching from forward blocking states to substantially equiconducting states.

To condition the matrix 30 for through current conduction, the thyristors in its various levels 41–44 are simultaneously triggered or fired by applying control signals to their respective gating means while the anode and cathode terminals 46 and 47 of the matrix are subjected to a forward bias voltage. The requisite control or trigger signals can be derived from any suitable source. Where these signals take the form of gating current pulses, it is convenient to use an external gate drive circuit (not shown) that is energized by the blocking voltage across the local matrix, to which it is connected via terminals 31 and 32, and that is arranged periodically, on command, to simultaneously supply the thyristor control terminals 49 of the respective levels 41–44 with steep-front, short duration pulses of current.

Although they are all triggered at the same time, some of the levels 41–44 of the matrix may actually turn on slightly faster than others. In this event, the voltage-dividing bypass network 48 enables the turn-on process successfully to proceed until even the slowest level has attained a forward conducting state. As is shown in FIG. 3, the bypass network 48 comprises four voltage equalizing series resistor-capacitor subcircuits 51, 52, 53, and 54 connected across the four levels of thyristors 41, 42, 43, and 44, respectively. The common junction of the subcircuits 51 and 53 is connected to the common junction of the thyristor levels 41 and 43 by way of a saturable core inductor 50, and the common junction of the subcircuits 52 and 54 is similarly connected to the common junction of the thyristor levels 42 and 44. The common junction of subcircuits 51 and 52 is connected to the common junction of a pair of feedback diodes 55 and 56 which, in series with additional pairs of diodes if desired, shunt the main inductor 45 of the matrix. As is more fully explained in Dewey's improvement application, previously cited, a capacitor 57 can be connected across a preselected portion of the total resistance of the adjoining subcircuits 51 and 52 in order to control the order in which the respective thyristor levels 41–44 are turned on when the matrix is subjected to a steep-front surge of abnormally high forward voltage. In this event, the levels 43 and 44 will be subjected to disproportionately high fractions of the voltage surge and will consequently turn on first, whereupon the inductors 50 prevent excessive $di/dt$ therein and also effect safe $dv/dt$ triggering of the last-on levels 41 and 42.

As can be seen in FIG. 3, the main saturable core inductor 45 of the matrix 30 is shunted by a pair of resistors R1 in series with the parallel combination of the feedback diodes 55, 56 and a subcombination comprising an auxiliary saturable core inductor 60 in series with another resistor 61. The primary function of this particular set of components is to suppress commutation transients that can be expected at the beginning of a period of commutation when all matrices in the incoming valve have switched to their forward conducting states. Operation of this circuitry is described in detail in the previously cited Dewey patent. By providing the auxiliary inductor 60 with a saturable core which, after the thyristors of the matrix are triggered, begins to saturate before the main inductor 45 begins to saturate, the size and expense of the main inductor have been reduced and the circuit efficiency increased.

As thus far described, the matrix shown in FIG. 3 is prior art, as is its associated gate drive circuit that simultaneously supplies periodic trigger signals to the respective sets of control terminals 49. Each level of the matrix is also provided with an overvoltage triggering circuit 70 which embodies the present invention. The details of a preferred embodiment of one such level 43 have been shown schematically in FIG. 4.

Figure 4:
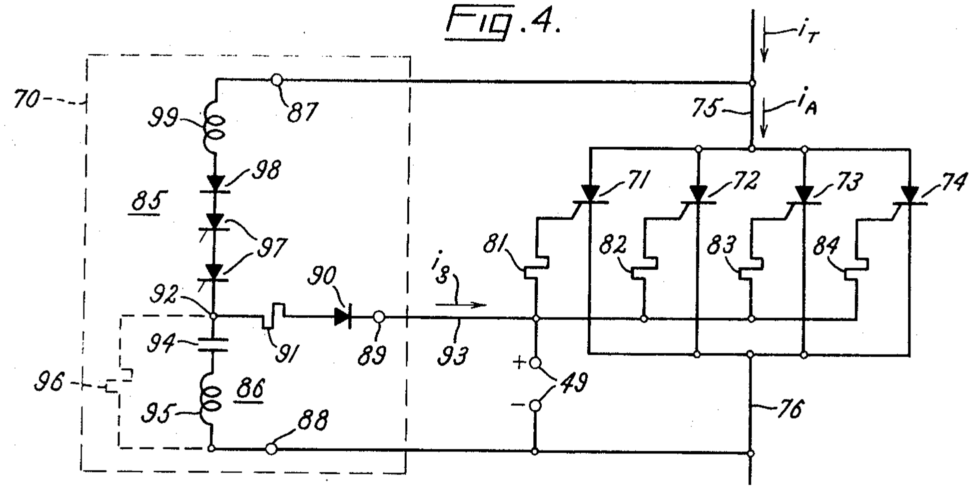
FIG. 4 is a schematic diagram of an array of parallel thyristors comprising one of the four levels of the matrix depicted symbolically in FIG. 3 and embodying the protective circuit of our invention.

The particular level or section of the switching matrix that is illustrated in FIG. 4 will be seen to comprise four individual main thyristors 71, 72, 73, and 74 whose corresponding main electrodes have been directly interconnected to form a parallel array of similarly poled devices. Each of these main thyristors is a high-power device having relatively large dimensions. By way of example, each thyristor may have a cylindrical insulating housing whose outside diameter is approximately 2 inches and whose axial dimension is approximately 1 inch. All four thyristors 71–74 can be physically disposed in a single pressure assembly with their respective anodes and cathodes clamped firmly between massive metal members which serve as electrical and thermal conductors, shown schematically at 75 and 76 in FIG. 4. The conductor 75 represents a common heat sink adjoining the anodes of these devices, and the conductor 76 represents another common heat sink adjoining the cathodes. By means of these conductors, the main electrodes of each thyristor are adapted to be connected in an electric power circuit such as that of the high-voltage valve 1 previously described, and when so connected each thyristor is periodically subjected to a forward bias voltage.

Each of the main thyristors 71–74 is equipped with gating means for turning on the thyristor when energized by a compatible control signal in the presence of forward bias on the main electrodes. Although it could take other forms which are known in the art, the gating means that has been shown symbolically in FIG. 4, for purposes of illustration, is a control electrode responsive to a gating current pulse of suitable polarity, magnitude, and duration. The control electrodes of all four thyristors 71–74 are conductively coupled, via equalizing resistors 81, 82, 83, and 84, respectively, to the associated set of control terminals 49 which are periodically supplied with a trigger signal from an external gate drive circuit. Thus the respective gate electrodes are arranged to share the same trigger signal. In this manner each of the thyristors 71–74 is cyclically triggered, in unison with the other thyristors in the same array, from a high-resistance (off) state to its low-resistance (on) state to control the commencement of forward current conduction between the conductors 75 and 76 as desired. The resistance valves of the respective resistors 81–84 are selected to help equalize the turn-on times of the four thyristors when forward biased by relatively low anode voltage. In FIG. 4 the total anode current flowing through the array when the thyristors are on is designated $i_A$.

As has been explained hereinbefore, the thyristors 71–74 are subject to being turned on without a trigger signal being applied to their gate electrodes whenever the instantaneous magnitude of their forward bias voltage increases to a level sufficiently above a normally applied peak forward blocking voltage to cause a voltage breakover. Thus a high-voltage thyristor having a rated peak forward blocking voltage of 2,600 volts might experience a voltage breakover if its anode voltage is allowed to attain a level of approximately 3,000 volts. This mode of turn-on is undesirable because it exposes the thyristor to serious damage if the initial *di/dt* is high. Furthermore, if a first one of the parallel thyristors 71–74 safely survives such turn on, it could be subsequently damaged by excessively high current if the companion thyristors, because of the collapse of anode voltage when the first one turned on, never breakover and consequently fail to conduct their share of $i_A$. In accordance with our invention, the danger of a voltage breakover is avoided by using the improved overvoltage triggering scheme which is illustrated in FIG. 4 and will next be described.

As is shown in FIG. 4, the overvoltage triggering circuit 70 of our invention comprises overvoltage sensing means 85 connected in series with energy storing means 86 between first and second terminals 87 and 88. The first terminal 87 is connected to the anode conductor 75 of the main thyristors 71–74, and the second terminal 88 is connected to the cathode conductor 76, whereby the serial combination of the overvoltage sensing means 85 and the energy storing means 86 is disposed in parallel circuit relationship with the parallel array of main thyristors. The triggering circuit 70 also has a third terminal 89 which is connected by way of an isolating diode 90 and a resistor 91 to the juncture 92 of its two parts 85 and 86. The gate electrodes of the main thyristors 71–74 are all coupled to the terminal 89 by means of a conductor 93.

In normal operation the overvoltage sensing means 85 is intended to be in a very high-resistance state, and the voltage impressed across it will therefore be substantially the same as whatever voltage is applied to the main thyristors 71–74. However, if and when its voltage increases to a value indicating that the forward bias voltage on the parallel thyristors has attained a threshold magnitude which is higher than the normally applied peak forward blocking voltage but lower than the breakover level of the main thyristors, the means 85 will switch abruptly to a low-resistance, unidirectional current conducting state. Upon operating in this fashion, the overvoltage sensing means 85 immediately conducts a sharply rising pulse of current between terminals 87 and 89, and this current supplies a trigger signal ($i_g$) for the gate electrodes of the main thyristors 71–74. Consequently the main thyristors are triggered by a sharp gate punch before the forward bias voltage can attain the critical breakover level.

The energy storing means 86 of the triggering circuit 70 comprises a capacitor 94 connected in series with an inductor 95 which serves momentarily to impede any current increase therein when the overvoltage sensing means 85 first switches to its conducting state, whereby most of the current initially conducted by the latter means is forced to supply the above-described trigger signal. As an optional feature of the circuit, a resistor 96 can be connected in shunt with the capacitor 94 and inductor 95 to reduce the amplitude of this trigger signal if desired. Although the inductor 95 is shown with an air core, it could have a magnetizable or saturable core if desired.

Once at least one of the main thyristors is turned on, current is diverted from the parallel overvoltage sensing means 85 and flows with rapidly increasing magnitude through that main thyristor. The resulting high rate of rise of anode current can be safely tolerated by the main thyristor whose anode voltage at the time of triggering has a relatively low magnitude due to the prior switching of the overvoltage sensing means 85. The overvoltage sensing means itself can tolerate a relatively high *di/dt* because of its relatively short conducting interval.

Any known device or circuit having the prescribed attributes can be used to form the above-described overvoltage sensing means 85. If desired, the sensing and switching functions of this part of the triggering scheme can be performed by two separate, parallel components. However, in the illustrated embodiment of our invention both functions are actually performed by a series combination of unidirectional conducting devices 97 and 98. All of these devices are poled to conduct current in the same direction as the parallel main thyristors 71–74. The devices 97 (two are shown in FIG. 4, although more or less can be used in practice) are PNPN semiconductor switching elements. While the latter elements can comprise a stack of individual semiconductor wafers inside a common housing, we are presently using a plurality of separate and discrete auxiliary thyristors which are serially interconnected in polarity agreement with one another, as shown. Preferably the device 98 is a simple diode (see below), and an inductor 99 is connected in series therewith.

Each of the auxiliary thyristors 97 is an overvoltage triggered controlled switching device having lower voltage and current ratings and smaller size than any one of the main thyristors 71–74. Its characteristic breakover voltage value is a predetermined fraction of the total voltage that will exist across the sensing means 85 when the forward anode voltage on the main thyristors attains the aforesaid threshold magnitude, and the predetermined fractions of all of the devices 97 are respectively selected so that their sum is equal to that total. In one embodiment of our invention, by way of example, this result was obtained by using three General Electric Series C–140 thyristors in series, each having an average forward current rating of 22 amps and a non-repetitive peak reverse voltage rating of 500 volts. Such devices can be triggered or turned on in a voltage breakover mode by applying across their respective main electrodes a forward voltage approaching 700 volts. In this example, the peak forward blocking voltage normally applied to the main thyristors 71–74 is less than 2,000 volts, and hence each of the auxiliary thyristors 97 normally remains in its high-resistance, non-conductive state. But as soon as the forward bias voltage on the main thyristors attains the aforesaid threshold magnitude (e.g., 2,100 volts), each of the auxiliary thyristors is operative to switch abruptly to a low-resistance, current-conducting state. Where a higher threshold is desired (e.g., 2,250 volts), it has proven convenient to use only one of the aforesaid C–140 thyristors in series with one General Electric C–137 thyristor which has approximately the same size and current rating as the C–140 but a higher PRV rating (1,000 volts) and a forward breakover voltage value approaching 1,600 volts.

The above-described arrangement offers a number of practical advantages. The auxiliary thyristors 97 are individually relatively small and inexpensive; for example, the housing of each device 97 has a diameter of only about one-half inch and a height that is approximately the same. The internal capacitance of such a device is relatively small, thereby avoiding a possible problem of premature, weak triggering of the main thyristors due to capacitor charging current between terminals 87 and 97 as the anode voltage approaches its threshold level. The *dv/dt* capability of such devices is desirably high, particularly at low temperatures. These thyristors are individually categorized as low voltage devices, and they can safely turn on in a voltage breakover mode with relatively high *di/dt*.

By connecting one or more diodes 98 in series with the auxiliary thyristors 97, we ensure that the reverse blocking voltage rating of the overvoltage sensing means 85 exceeds that of the parallel main thyristors 71–74. The added diodes can have low average forward current ratings, e.g., 3 amperes.

Figures 5, 7B:
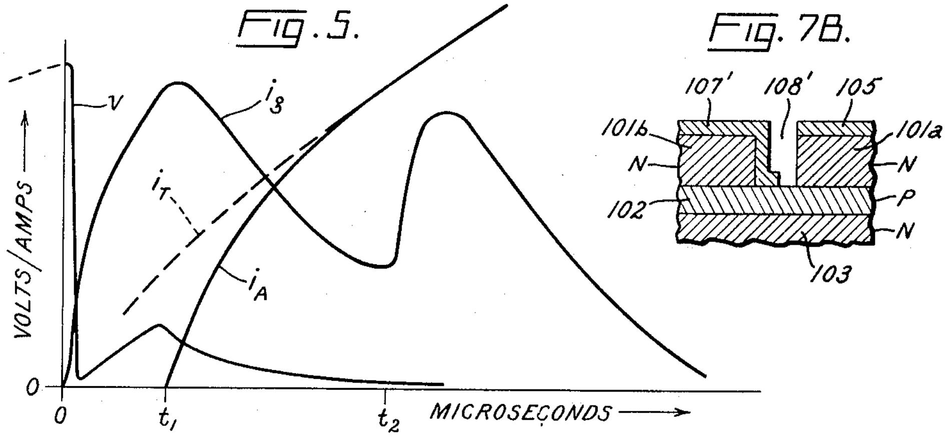
FIG. 5 is a time chart of certain voltage and currents existing in the circuit of FIG. 4 during operation thereof.
FIGS. 7A and 7B are partial elevational views of two modified forms of the FIG. 7 element.

To further explain and clarify our invention, we will now refer to FIG. 5 which illustrates the operation of the overvoltage triggering scheme previously described. It is assumed that prior to zero time in FIG. 5 all of the main thyristors 71–74 and auxiliary thyristors 97 in FIG. 4 are off, and the anode voltage $v$ across the main thyristors is rising toward an excessively high level. At zero time, the voltage $v$ just attains the forward overvoltage magnitude that causes an avalanche breakdown of the auxiliary thyristors. (In practice the threshold magnitude of v tends to increase with the rate of rise of the voltage surge, but the parameters of our triggering circuit 70 are so selective that for any *dv/dt* within given limits the level at which triggering actually takes place will fall in a range whose minimum is higher than the normally applied peak forward blocking voltage and whose maximum is lower than the level of forward bias voltage that will cause voltage breakover of the main thyristors.) When triggered in this mode, the auxiliary thyristors 97 abruptly switch to low-resistance states in which they can no longer support the applied voltage, and within a fraction of a microsecond the voltage $v$ collapses to a relatively low value as shown. Current now increases rapidly through the auxiliary thyristors. Since any current increase in the energy storing branch 86 of the circuit 70 is momentarily impeded by the inductor 95, most of the current initially conducted by the auxiliary thyristors is forced to supply gate current $i_g$ from the terminal 89 to the cathode conductor 76 via the conductor 93 and the gating means of the main thyristors 71–74.

From zero time to $t_1$ in FIG. 5, all of the current $i_T$ that flows through the circuits depicted in FIG. 4 will be conducted by the auxiliary thyristors 97. The initial rate of rise of $i_T$ depends on the external system from which this current is derived, and it is additionally limited by the inductor 99 in the triggering circuit 70. For this purpose the inductor 99 may have an inductance in the range of 5 to 40 microhenrys; alternatively it could be omitted altogether if desired. It will be recalled that the individual auxiliary thyristors are not high voltage devices, and they can safely tolerate relatively high *di/dt* when turned on in their voltage breakover mode. In addition, as will presently appear, they are soon relieved of their conducting duty and therefore can operate at ambient temperature which further improves their *di/dt* capabilities.

At the juncture 92 of the auxiliary thyristors 97 and the energy storing means 86, the total current $i_T$ splits between the latter means and the gating circuits of the main thyristors. The gate current $i_g$ rises steeply from zero as shown. (It should be noted here that in FIG. 5 the current scale has been expanded for $i_g$ compared to the scale for $i_T$.) At the same time, the capacitor 94 in the energy storing means 86 is being charged by the current which traverses the same. This raises the potential of juncture 92 with respect to the cathode conductor 76, and consequently an increasing forward bias voltage $v$ is imposed on the main thyristors 71–74. The current in the energy storing means 86 is oscillatory, and the parameters of the capacitor 94 and the series inductor 95 which comprise this branch of the triggering circuit 70 are selected so that a half-period of their natural oscillation is in the range of approximately 2 to 8 microseconds. By way of example, a capacitor of 0.1 microfarads and an inductor of 25 microhenrys could be used.

After the main thyristors 71–74 have been supplied with gate current for a short interval which is typically of the order of 2 microseconds (known as the delay time), at least a first one of these devices will turn on, and anode current $i_A$ commences. At this moment, marked $t_1$ in FIG. 5, the gate current $i_g$ has risen to a substantial magnitude (e.g., 15 amperes). If less gate current were desired, a resistor 96 could be connected across the energy storing means 86, as is indicated by broken lines in FIG. 4. As will be observed in FIG. 5, the forward bias voltage $v$ on the main thyristors at the time $t_1$ is still low and rising. Because of the sharp gate punch supplied by our overvoltage triggering circuit, the reduced anode voltage, and the positive *dv/dt*, the first-on main thyristor can safely tolerate the high *di/dt* that results when the through current $i_T$ then flowing in the circuit 70 transfers to the preferred path which that thyristor provides.

The initially steep rise of anode current $i_A$ is clearly shown in FIG. 5. The gate current $i_g$ begins decaying, and the current in the energy storing means 86 will oscillate to zero and reverse. The latter branch of the triggering circuit 70 will now serve as a source or generator of the gate current $i_g$, thereby sustaining a trigger signal of sufficient magnitude and duration to ensure successful turn-on of all of the main thyristors 71–74 in the event that some of them did not start conducting at time $t_1$. This source also reverse biases the auxiliary thyristors 97 which are soon turned off thereby, an event indicated at time $t_2$ in FIG. 5. When reverse recovery current ceases in the auxiliary thyristors, $i_g$ abruptly increases as shown. Thereafter all of the remaining discharge current from the capacitor 94 in the energy storing means 86 will flow through the gate-cathode circuits of the main thyristors. Gate current oscillations are damped by the resistance (e.g., 30 ohms) of the resistor 91.

During the above-described operation, the triggering circuit 70 in effect supplies two consecutive gate pulses to the paralleled main thyristors 71–74. The first wave of gate current rises sharply, and it quickly triggers at least one of the main thyristors. This is followed by another strong wave which enhances the turn-on action of the slowest thyristor in the parallel array. Both turn-on actions occur after the forward bias voltage across the main thyristors has collapsed to a relatively low, safe level. Thus the main thyristors are protected by the auxiliary thyristors from the shock of turning on with high anode voltage. The auxiliary thyristors in turn are protected by the main thyristors from overheating; at least one of the latter will turn on with such a short delay time that it quickly relieves the auxiliary thyristors of load current duty.

By employing our improved overvoltage triggering scheme and its attendant advantages in a solid-state valve having a given high voltage rating, fewer levels of series-connected main thyristors are needed, the inductors 45 can have less inductance, and certain prior art auxiliary components can be reduced in size or eliminated altogether. For example the *dv/dt* limiting inductors 13, 14, and 15 shown in FIG. 1 can be made much smaller, and the grating capacitors 21 shown in FIG. 2 can be omitted. The capacitor 57 shown in FIG. 3 can also be omitted.

We have found that a valve equipped with our invention can safely turn on in the manner hereinbefore described on a 60-hertz repetitive basis if desired. This offers the possibility of eliminating at least some of the external gate drive circuits usually associated with the respective matrices of the valve. In certain applications (e.g., inverters), it may be advantageous to use our scheme for normally controlling the valve, in which event the trigger signals could be supplied to the gates of the auxiliary thyristors 97 instead of directly to the gates of the main thyristors 71–74.

When constructed and arranged in the particular manner hereinbefore described, our overvoltage triggering scheme operates entirely satisfactorily. Nevertheless, further improvements can be obtained by using for the unidirectional conducting devices 97 an auxiliary thyristor having the attributes that are disclosed and claimed in U.S. Pat. No. 3,408,545—DeCecco et al. For even more ideal performance, we contemplate using special overvoltage triggered switching elements whose $V_{BO}$ characteristics are optimized for this application. Such a device, which has been claimed in our copending divisional application, Ser. No. 198,798, filed Nov. 15, 1971, is shown in FIGS. 6 and 7.

Figures 6, 7:
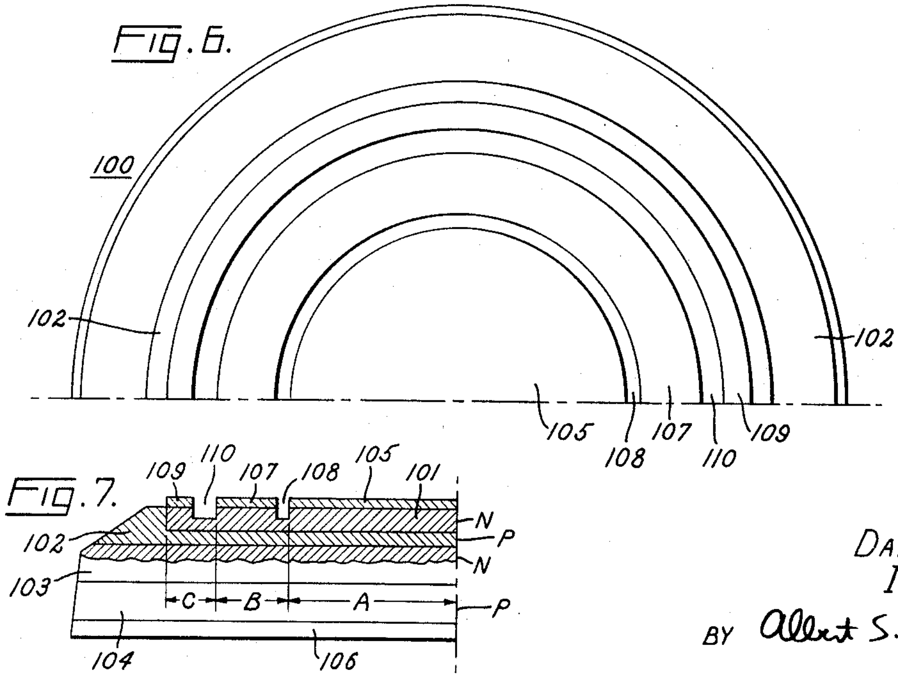
FIG. 6 is a partial plan view of an improved overvoltage triggered semiconductor element that can be used in the protective circuit shown in FIG. 4.
FIG. 7 is an elevational view, partly in section, of the element shown in FIG. 6.

FIG. 6 is a plan view of one-half of a symmetrical disc-like PNPN semiconductor element 100, and FIG. 7 is a partial sectional view (not to scale) of the left half of the element shown in FIG. 6. Only the essential parts of the illustrated embodiment of the element 100 are described below; a person skilled in the art will recognize that this element can be made by a variety of well-known methods and that it can be encapsulated in a variety of known structures to form a complete device. If more information is needed, it can be obtained from the above-mentioned DeCecco et al. patent which is incorporated herein by reference.

Like the subject matter of DeCecco et al., the special element 100 shown in FIGS. 6 and 7 comprises a body of semiconductor material (e.g., silicon) having four layers or zones, 101, 102, 103, and 104 arranged in succession, with contiguous layers being of different conductivity types. Thus the end layer or emitter 101 of the semiconductor body is of N-type conductivity, the intermediate layer or base 102 that is contiguous with emitter 101 is of P-type conductivity, the next intermediate layer 103 comprises N-type conductivity, and the other end layer 104 is of P-type conductivity. The interface boundaries between the respective layers form rectifying junctions. A metallic contact 106 is disposed on and joined to the P-type end layer 104 of the element in a manner forming a low-resistance ohmic junction therewith, and this contact comprises the anode of the element 100. A thin metallic contact 105 is connected in a similar manner to a central region A of the opposite N-type end layer 101 of the element, and this contact comprises the cathode. As thus constructed, the element 100 is a thin, circular wafer which is intended to be disposed between a pair of spaced-apart main current-carrying electrodes in a sealed housing. The complete device will have appropriate means for connecting the exposed face of the cathode 105 to a cooperating surface of one of these main electrodes and for connecting the anode 106 to the other main electrode.

Outside the central or main region A of the N-type end layer 101 of the element 100 there are two laterally adjacent, concentric auxiliary regions B and C. Both of these auxiliary regions are free of cathode connections. The first auxiliary region B is adjacent to the lateral border of the main region A, and it has connected thereto an annular island or ring 107 of electroconductive material (e.g., gold) which is spaced apart from the cathode 105 by a channel 108. The outboard auxiliary region C circumscribes B and preferably has connected thereto an annular island or ring 109 of electroconductive material which is spaced apart from the ring 107 by a channel 110.

The auxiliary regions B and C of the end layer 101 are characterized by relatively high lateral resistances, with the lateral resistance of the outboard region C being appreciably higher than that of region B. This can be conveniently accomplished by controlling the dimensions of the N-type end layer 101 under the respective channels 108 and 110. Exemplary dimensions will be suggested hereinafter.

The element 100 is so constructed and arranged that when turning on in its forward voltage breakover mode, breakover begins somewhere near the periphery of the wafer. As used herein, the term "peripheral" refers to the areas of the element 100 that are outside the compass of the cathode 105. Preferably a peripheral location of the breakover action is assured by appropriately controlling the angle of the surface bevel which is provided around the external edge of the center rectifying junction of the wafer in a known manner.

If and when the forward bias voltage applied to the anode of a nonconducting elemeht 100 increases to a predetermined critical value, the element will breakover. This happens because leakage current flowing over the surface of the wafer across the external edge of its center junction and through the PN junction between the contiguous layers 101 and 102 increases at some point to a sufficiently high density to trigger a small peripheral area of the wafer. Now this area will provide a path for main current to flow from the anode 106 to the cathode 105. The interlayer path that initially conducts main current includes the auxiliary region B which is located in the end layer 101 between the first peripheral area to conduct and the cathode 105. The auxiliary region B is so constructed and arranged that at least a portion of the initial main current is forced to traverse the rectifying junction that is formed between the adjoining P-layer 102 and the main region A of the N-layer 101. This current is encouraged by the ring 107 to spread out around the perimeter of the main region. At the same time a potential difference is developed across the channel 108. Where it crosses the last-mentioned junction, the main current acts as a high-energy, peremptory trigger signal for a broad area of the wafer subtending substantially the whole perimeter of the cathode 105, thereby turning on the element 100 with the double-triggering action more fully explained in DeCecco et al. Consequently the initial small-area, high-voltage breakover action is converted inside the element 100 to a large-area, lower voltage gate triggering action which materially improves the turn-on *di/dt* capability of the element.

In accordance with the invention claimed in the aforesaid divisional application, we have added the auxiliary region C to the prior device to reduce the possibility of improper operation due to a possible effect we call "underpass." The auxiliary region C is so constructed and arranged that the aforementioned leakage current at breakover (also known as "avalanche current") usually flows under region C and first triggers a portion of the auxiliary region B that subtends the ring 107, whereby the two-step triggering process previously described is sure to take place. Without the extra auxiliary region C, there is a risk of passing under the auxiliary region B and initially triggering only a small area of the main region A, in which event the second, amplified step of the desired turn-on process would be undesirably omitted. In our improved device, double triggering and its attendant advantages are ensured. Even if a certain part of the initial leakage current flows directly to the main region A, the auxiliary region B is always the first to be triggered because its current density will be higher than at A. (Actually there is a possibility that even before B turns on, the leakage current may trigger the outboard auxiliary region C of the element 100, in which event the turn on process can be characterized as "triple triggering"[C–B–A] which is harmless.)

The foregoing is achieved by optimizing the auxiliary region B while making the auxiliary region C susceptible to the underpass effect. By way of example, in a high-voltage broad-area wafer (e.g., 33 mm. diameter) the lateral resistance of the auxiliary region B can be of the order of 1.0 ohm (measured between the cathode 105 and the ring 107), and that of the auxiliary region C can be much greater, for example 50 ohms (measured between the rings 107 and 109). In the illustrated embodiment of our invention, this result has been obtained by controlling the dimensions of the channels 108 and 110 which preferably are formed by known etching techniques. More specifically, the width (radial dimension) of the channel 108 was made less than 1 mm., the width of the ring 107 was greater than 2.5 mm., the width of the channel 110 was greater than 1 mm., and the width of the ring 109 was less than 1.5 mm. In this manner we practically assure that enough leakage current will always prefer to cross the PN junction between the P-layer 102 and the auxiliary region B of the emitter to cause double triggering, a result that is substantially more difficult to obtain with certainty in an element not having the extra auxiliary region C due to the unpredictable distribution of leakage current in peripheral areas of its layer 102 just prior to breakover.

In a PNPN element of given overall size, the extra auxiliary region C is added at the cost of reducing the diameter and hence the active area of the cathode 105. This consequently reduces the main current carrying rating of the element. However, this is no handicap in the overvoltage sensing and switching circuit 85 where, as previously noted, the continuous current duty is very small. In fact we contemplate using for the devices 97 in this circuit a plurality of small PNPN elements 100 in series, each element having a normal current rating as low as 1 amp RMS. The latter arrangement offers the advantages of less internal capacitance, easier manufacturing (e.g., more uniform characteristics and higher yields), and greater flexibility in matching whatever predetermined overvoltage magnitude may be specified.

Figure 7A:
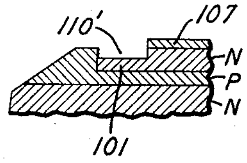

In a modified form of the element 100, the overlying ring 109 is omitted from the auxiliary region C. This is shown in FIG. 7A which is a partial sectional view of the element which is otherwise similar to that shown in FIG. 7. An annular channel 110' extends across the full width of the reduced-depth perimeter of the N-type end layer 101. Thus the channel 110' defines the auxiliary region C in the FIG. 7A version of the element, and this region provides the underpass effect previously referred to.

Another modification of the element is depicted in FIG. 7B which is an enlarged partial sectional view of a modified auxiliary region B. In this case the electro-conductive ring 107' is spaced from the cathode 105 by an annular channel of gap 108' which extends all the way to the intermediate P-layer 102, thereby dividing the N-type end layer into two portions **101*a* and 101*b*. Portion 101*a* is the main region A of the end layer, and the laterally displaced portion 101*b* is the auxiliary region B of the same layer. In the fashion of a pilot gate, the electroconductive ring 107' is brought into direct contact with a portion of the P-layer 102 exposed between 101*a* and 101*b***.

The operation of this modification of our invention is essentially the same as that previously described in connection with FIGS. 6 and 7. In a known manner, the ring 107' and the cathode 105 can be interdigitated if desired. This is also true of the other embodiments of our invention, and we do not intend the words "annular" and "ring" as used herein to be limited to circular configurations.

It is important that the element 100 have good *dv/dt* characteristics, and toward this end those skilled in the art will recognize that it should be made by the known alloyed-diffused process or, if all diffused, it should be provided with a shorted emitter.

While various alternative forms of our invention have been hereinbefore described by way of illustration, other modifications will probably occur to those skilled in the art. For example, the overvoltage triggering circuit 70 could be advantageously used to protect other types of devices or switches having characteristics similar to the main thyristors 71–74 previously described. We therefore intend, by the concluding claims, to cover all such changes and modifications as fall within the true spirit and scope of the invention.

What we claim as new and desire to secure by Letters Patent of the United States is:

1. An improved overvoltage triggering scheme for turning on at least a first main thyristor, said thyristor including a pair of main electrodes and a gating means, said main electrodes being adapted to be connected in an electric power circuit where they are periodically subjected to a forward bias voltage (anode potential positive with respect to cathode), said thyristor when forward biased being adapted to be turned on if either a trigger signal is applied to its gating means or the instantaneous magnitude of the forward bias voltage increases to a level sufficiently above a normally applied peak forward blocking voltage to cause a voltage breakover, wherein the improvement comprises:

a. overvoltage sensing means;
b. energy storing means;
c. means for connecting said overvoltage sensing means and said energy storing means in series with each other and in parallel with said thyristor; and
d. means for coupling the gating means of said thyristor to the juncture of said sensing and storing means;
e. said overvoltage sensing means comprising at least one unidirectional conducting device poled to conduct current in the same direction as said main thyristor, said sensing means having a normal high-resistance state and being operative to switch abruptly to a low-resistance, current conducting state in high-speed response to the forward bias voltage on said thyristor attaining an overvoltage magnitude which is higher than said peak forward blocking voltage and lower than said breakover level;
f. said energy storing means being arranged momentarily to impede any current increase therein when said sensing means first switches to its conducting state in response to an overvoltage condition, whereupon most of the current initially conducted by said sensing means is forced to supply said trigger signal for said gating means and said first main thyristor is quickly turned on by a sharp gate punch before its forward bias voltage can attain said breakover level.

2. The improvement of claim 1 in which said overvoltage sensing means has negligible capacitance.

3. The improvement of claim 1 in which said coupling means comprises a conductive connection including a resistor.

4. The improvement of claim 3 in which said overvoltage sensing means comprises an inductor connected in series with said unidirectional conducting device.

5. The improvement of claim 3 in which said energy storing means comprises a capacitor connected in series with an inductor.

6. The improvement of claim 5 in which said energy storing means is shunted by a resistor.

7. The improvement of claim 1 in which said unidirectional conducting device comprises a PNPN semiconductor element.

8. The improvement of claim 7 in which a plurality of PNPN semiconductor elements are serially interconnected in polarity agreement with one another to form said overvoltage sensing means.

9. The improvement of claim 7 in which said PNPN semiconductor element comprises:

a. a semiconductor body having four layers arranged in succession with contiguous layers being of different conductivity types, whereby rectifying junctions are formed between contiguous layers of the body;
b. a main current-carrying contact;
c. means for connecting said contact to a predetermined end layer of said body;
d. said predetermined end layer comprising a central main region joined to said contact, a first auxiliary region disposed adjacent to the lateral border of said main region, and a second auxiliary region disposed outboard with respect to said first auxiliary region, all of said regions being contiguous with the intermediate layer of said body that adjoins said predetermined end layer;
e. a ring of electroconductive material spaced apart from said contact and connected to said first auxiliary region;
f. said second auxiliary region being characterized by a lateral resistance appreciably higher than the resistance between said ring and said contact; and
g. said semiconductor body being so constructed and arranged that, when said overvoltage condition occurs, leakage current triggers a peripheral area thereof.

10. The improvement of claim 1 in which said overvoltage sensing means comprises a plurality of unidirectional conducting devices which are serially interconnected in polarity agreement with one another.

11. The improvement of claim 10 in which at least one of said unidirectional conducting devices comprises an auxiliary thyristor.

12. The improvement of claim 1 in which the gating means of said thyristor is adapted to be coupled to an external source of periodic trigger signals.

13. The improvement of claim 12 in which said coupling means comprises a conductive connection including an isolating diode in series with a resistor.

14. For triggering a switch having characteristics similar to those of a thyristor including a pair of main electrodes and control means adapted to receive a trigger signal, a circuit which comprises:

a. a first terminal adapted to be connected to one of said main electrodes, a second terminal adapted to be connected to the other main electrode, and a third terminal;
b. means for coupling said third terminal to the control means of said switch;
c. a capacitor connected in series with an inductor between said second and third terminals; and
d. at least two auxiliary thyristors serially interconnected in polarity agreement with one another between said first and third terminals, said auxiliary thyristors being arranged to turn on in a voltage breakover mode in response to forward bias voltage across the main electrodes of said switch increasing to a predetermined magnitude.

15. The triggering circuit of claim 14 wherein said switch comprises at least one main thyristor and said auxiliary thryistors are so selected that said predetermined voltage magnitude is lower than the level of forward bias voltage that can cause damage to said main thyristor.

16. An improved triggering scheme for turning on at least a first main thyristor having relatively large dimensions, said thyristor including a pair of main electrodes and a gating means, said main electrodes being adapted to be connected in an electric power circuit where they are subjected to a forward bias voltage which, if allowed to increase to a sufficiently high level, can cause a voltage breakover of said main thyristor, wherein the improvement comprises:

a. voltage sensing means;
b. energy storing means comprising a capacitor connected in series with an inductor;
c. means for connecting said voltage sensing means and said energy storing means in series with each other and in parallel with said thyristor; and
d. means for coupling the gating means of said thyristor to the juncture of said sensing and storing means;
e. said voltage sensing means comprising a plurality of normally non-conductive overvoltage triggered controlled switching elements which are serially interconnected in polarity agreement with one another, each of said elements being smaller in size than said main thyristor and being operative to switch abruptly to a low-resistance, current conducting state in high-speed response to the voltage across that element reaching a value which is a predetermined fraction of the voltage existing across said sensing means when the forward bias voltage on said main thyristor attains a predetermined magnitude which is not as high as said breakover level.

17. The improvement of claim 16 in which said elements are auxiliary thyristors, at least two of said auxiliary thryistors having forward voltage breakover values which differ from each other, and the sum of the individual voltage breakover values of all of said auxiliary thyristors being equal to 100 percent of the voltage existing across said sensing means when the forward bias voltage on said main thyristor attains said predetermined magnitude.

18. For protecting at least two duplicate main thyristors from overvoltage, said thyristors each having a pair of main electrodes and a gating means, with the corresponding main electrodes s of the respective thyristors being directly interconnected to form a parallel array of similarly poled thyristors, said array being adapted to be connected in a high-current electric power circuit where said thyristors are subject to voltage breakover if the instantaneous magnitude of forward bias voltage on said array increases to a sufficiently high level, the improvement comprising:

a. overvoltage sensing means;
b. energy storing means;
c. means for connecting said overvoltage sensing means and said energy storing means in series with each other and in parallel with said array; and
d. means for coupling the gating means of all of said thyristors to the juncture of said sensing and storing means;
e. said overvoltage sensing means comprising at least one unidirectional conducting device poled to conduct current in the same direction as said main thyristors, said sensing means having a normal high-resistance state and being operative to switch abruptly to a low-resistance, current conducting state in response to the forward bias voltage on said array of thyristors attaining a predetermined overvoltage magnitude which is lower than said breakover level;
f. said energy storing means being arranged momentarily to impede any current increase therein when said sensing means first switches to its conducting state in response to an overvoltage condition, whereupon most of the current initially conducted by said sensing means is forced to supply a trigger signal for said gating means and at least a first one of said main thyristors is quickly turned on by a sharp gate punch before its forward bias voltage can attain said breakover level, said energy storing means being further arranged to serve as a source of current which sustains said trigger signal after said first one of said thyristors is turned on, thereby generating a trigger signal of sufficient magnitude and duration to ensure successful turn-on of all of the thyristors in said array.

19. The improvement of claim 18 wherein each of said main thyristors has an anode and a cathode, and a first common heat sink is provided for the anodes of all of said main thyristors and a second common heat sink is provided for the cathodes of all of said main thyristors.

20. For protecting a plurality of main thyristors from overvoltage, said thyristors each having a pair of main electrodes and a gating means, with the main electrodes of the respective thyristors being interconnected in a series string which is adapted to be connected in a high-voltage electric power circuit, the improvement comprising an equal plurality of overvoltage triggering circuits respectively associated with said main thyristors, each of said circuits comprising:

a. overvoltage sensing means;

b. energy storing means;

c. means for connecting said overvoltage sensing means and said energy storing means in series with each other and in parallel with the associated main thyristor; and d. means for coupling the gating means of said associated thyristor to the juncture of said sensing and storing means;

e. said overvoltage sensing means having a normal high-resistance state and being operative to switch abruptly to a low-resistance, current-conducting state in response to forward bias voltage across the main electrodes of said associated thyristor increasing to a predetermined overvoltage magnitude;

f. said energy-storing means being arranged momentarily to impede any current increase therein once said sensing means first switches to its conducting state in response to an overvoltage condition, whereupon most of the current initially conducted by said sensing means is forced to supply a trigger signal for the gating means of said associated thyristor which is consequently turned on by a sharp gate punch.

* * * * *